United States Patent [19]

Konno

[11] Patent Number: 5,384,486

[45] Date of Patent: Jan. 24, 1995

[54] INTEGRATED CIRCUIT DEVICE HAVING SIGNAL WIRING STRUCTURE OF ULTRAHIGH-SPEED PERFORMANCE

[75] Inventor: Mitsuo Konno, Yokohama, Japan

[73] Assignee: Kabushiki Kaisha Toshiba, Kawasaki, Japan

[21] Appl. No.: 26,195

[22] Filed: Feb. 26, 1993

Related U.S. Application Data

[63] Continuation of Ser. No. 724,717, Jul. 2, 1991, abandoned.

[30] Foreign Application Priority Data

Jul. 2, 1990 [JP] Japan .................. 2-172705

[51] Int. Cl.$^6$ .................. H01L 27/10; H01L 27/15; H01L 23/48; H01L 29/46
[52] U.S. Cl. .................. 257/752; 257/753; 257/275; 257/276; 257/296
[58] Field of Search .................. 357/45, 71; 257/752, 257/296, 275, 276, 753

[56] References Cited

U.S. PATENT DOCUMENTS

| | | | |
|---|---|---|---|
| 3,890,636 | 6/1975 | Harada et al. | 257/752 |
| 4,642,580 | 2/1987 | Scott | 331/117 D |
| 4,654,689 | 3/1987 | Fujii | 357/51 |
| 4,866,507 | 9/1989 | Jacobs et al. | 357/74 |
| 4,916,520 | 4/1990 | Kurashima | 357/71 |
| 4,972,250 | 11/1990 | Omori et al. | 357/54 |
| 4,989,062 | 1/1991 | Takahashi et al. | 357/45 |
| 5,027,189 | 6/1991 | Shannon et al. | 357/71 |
| 5,075,253 | 12/1991 | Sliwa, Jr. | 437/209 |
| 5,095,352 | 3/1992 | Noda et al. | 357/45 |
| 5,112,761 | 5/1992 | Matthews | 437/31 |

FOREIGN PATENT DOCUMENTS

| | | | |
|---|---|---|---|
| 0154998 | 9/1985 | European Pat. Off. | 357/45 |
| 0163384 | 12/1985 | European Pat. Off. | 357/45 |
| 0233085 | 8/1987 | European Pat. Off. | |
| 0309805 | 4/1989 | European Pat. Off. | |
| 2207808 | 2/1989 | United Kingdom | 357/45 |

OTHER PUBLICATIONS

Patent Abstracts of Japan, vol. 10, No. 347, Nov. 21, 1986.
Patent Abstracts of Japan, vol. 12, No. 9, Jan. 12, 1988.

*Primary Examiner*—Andrew J. James
*Assistant Examiner*—Stephen D. Meyer
*Attorney, Agent, or Firm*—Oblon, Spivak, McClelland, Maier & Neustadt

[57] ABSTRACT

An integrated circuit device has a substrate, a plurality of circuit elements or units arranged on the substrate and having terminals, a plurality of signal lines connected between the terminals of the circuit elements or units, or between the terminals and external connection terminals, and an alternating current ground line provided close to the signal lines to determine a transmission characteristic of the signal lines, the alternating current ground line including a high-potential direct current power source line and a low-potential direct current power source line, the high-potential direct current power source line and the low-potential direct current power source line being vertically separated by a dielectric layer.

7 Claims, 6 Drawing Sheets

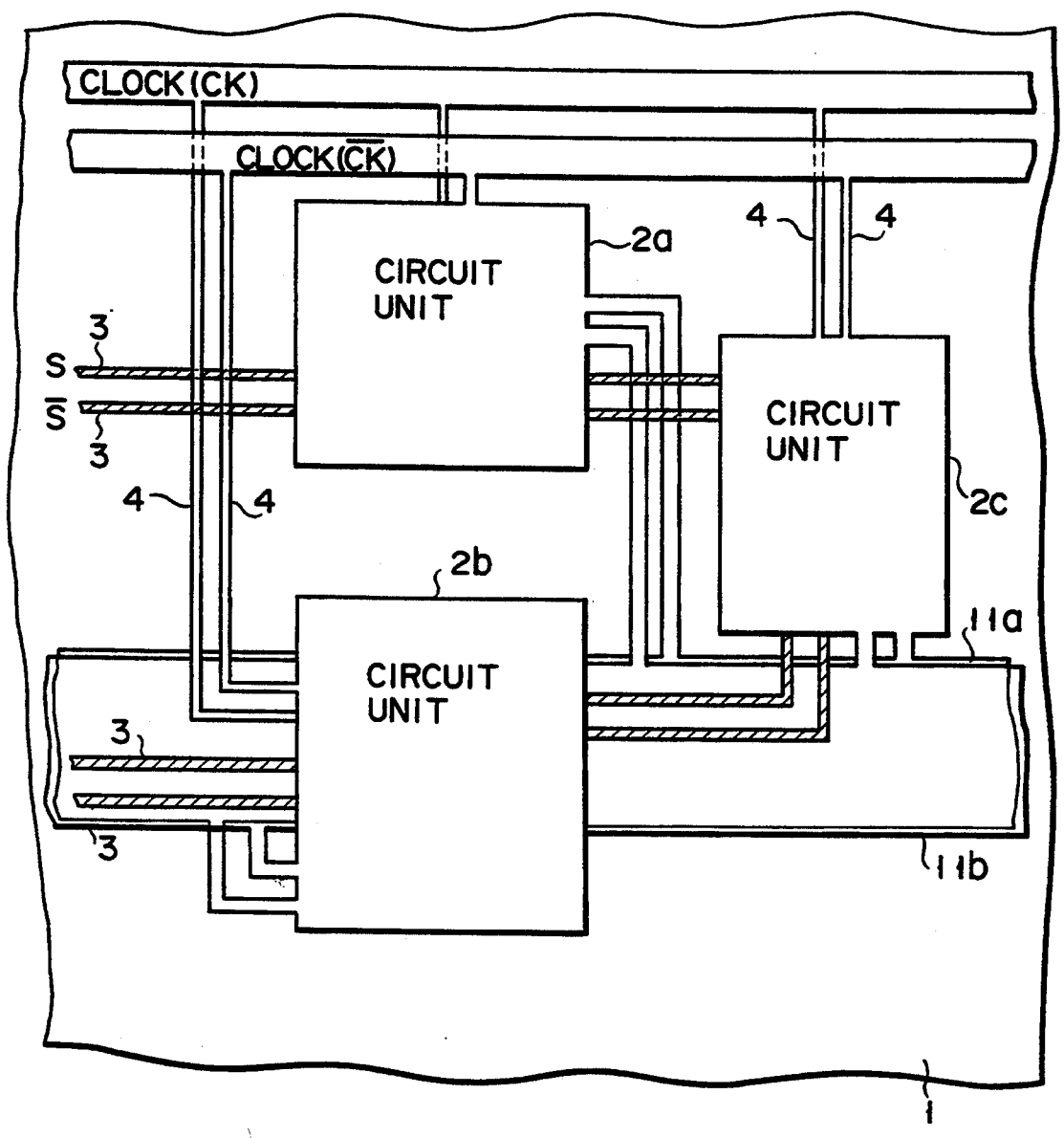
F I G. 1

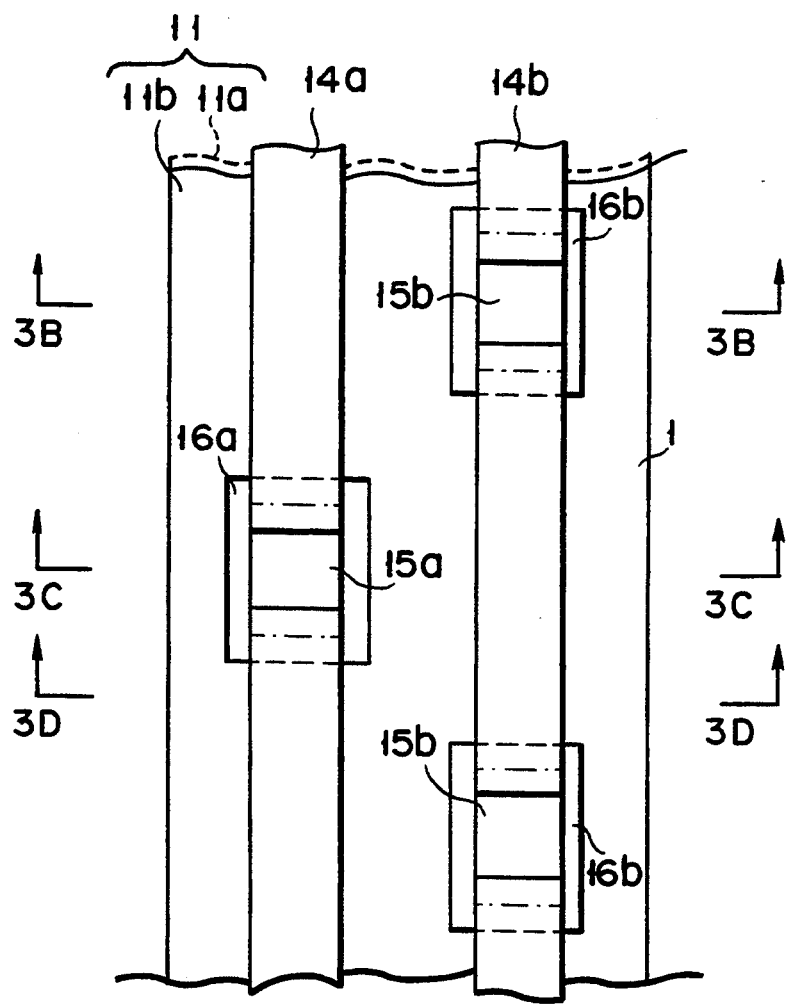
F I G. 3A
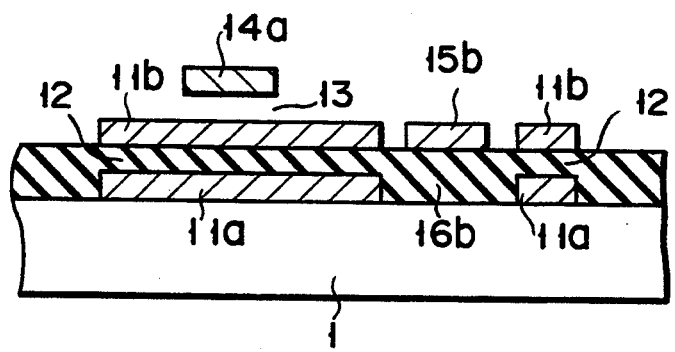
F I G. 3B

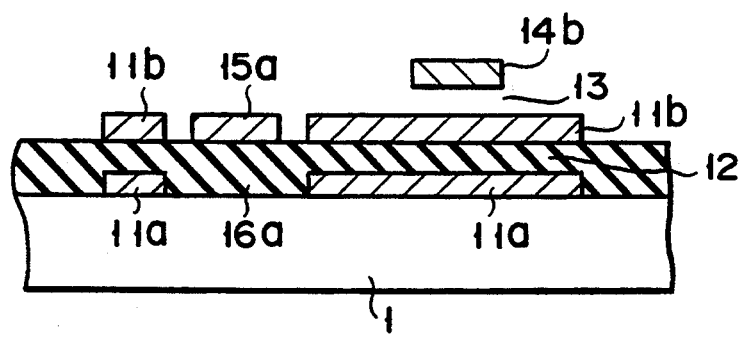
F I G. 3C
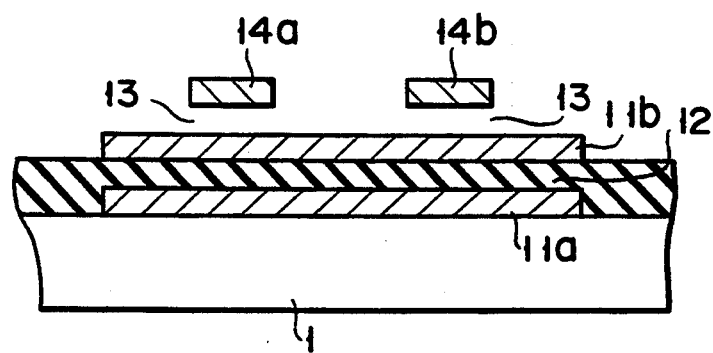
F I G. 3D

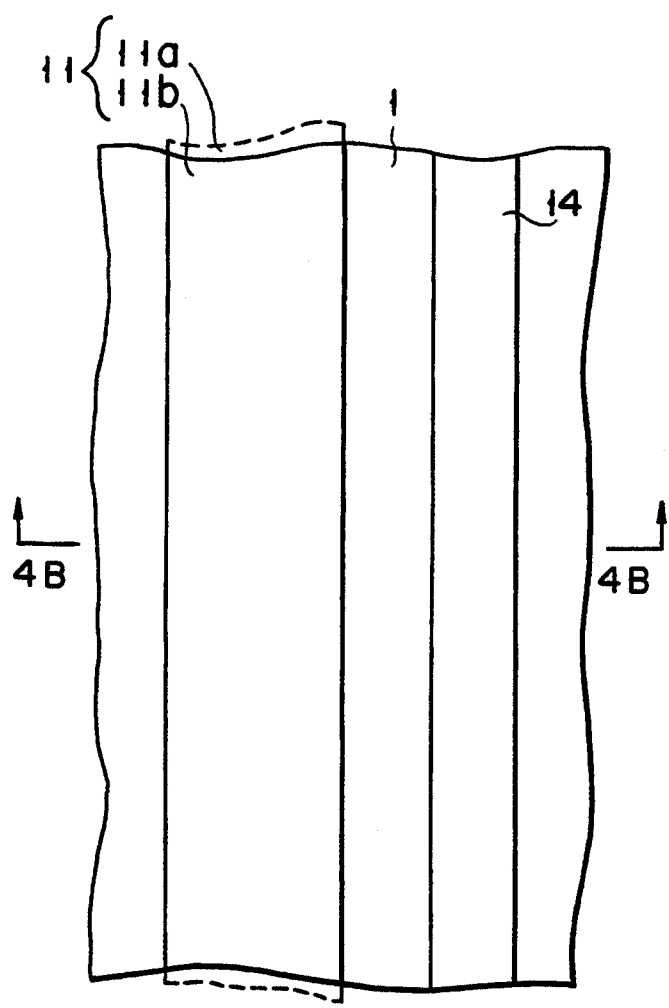
F I G. 4A
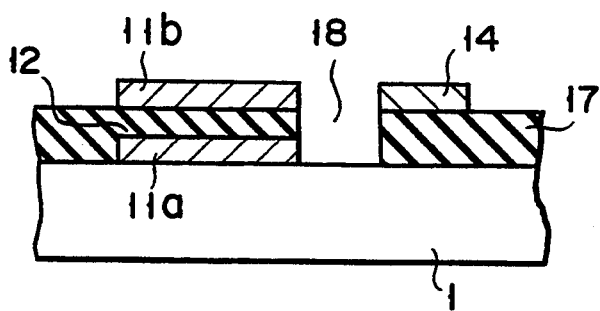
F I G. 4B

INTEGRATED CIRCUIT DEVICE HAVING SIGNAL WIRING STRUCTURE OF ULTRAHIGH-SPEED PERFORMANCE

This application is a continuation of application Ser. No. 07/724,717, filed on Jul. 2, 1991, now abandoned.

BACKGROUND OF THE INVENTION

1. Field of the Invention

The present invention relates to an integrated circuit device including a monolithic integrated circuit and a hybrid integrated circuit and, more particularly, to an improvement in a signal wiring structure of an integrated circuit having an ultrahigh-speed performance.

2. Description of the Related Art

A semiconductor device which is used in an optical communication device, a super computer and the like and operates in the GHz band has recently made a rapid development. In particular, the performance of basic elements, e.g. an HBT an HEMT, a GaAs-MESFET, an Si bipolar transistor, and the like has been improved and the performance of an integrated circuit using such an element has been improved accordingly.

The physical size of a conventional integrated circuit chip is as small as about a value between eleven to nineteen mm mainly due to a limitation in manufacturing technique. Substantially no consideration has been made to the length of a signal line, and consideration has been made on only minimization of the wiring capacitance because of the drive capacity. As a result thinning of a signal line as much as the process and the yield permit has generally been performed.

However, such thinning of a signal line to provide a higher operation speed is limited. More specifically, no matter how thin a signal line is made, a capacitance C accompanying a spatial impedance remains, and thus a decrease in capacitance is limited. An increase in series resistance R and a series inductance L (both are inversely proportional to the sectional area of a wire) accompanying the thinning cannot be ignored. As a result, the signal transmission delay caused by these C, R, and L becomes large.

For these reasons, in order to improve the performance of, e.g, an integrated circuit that operates in the GHz band, not only the performance of the elements but also the overall performance of the wiring including signal lines and power source lines must be improved.

In a conventional integrated circuit, signal lines (forward lines) and power source lines (backward lines) are arranged independently of each other in accordance with their applications. Therefore, when such an integrated circuit is operated at an ultrahigh speed, a difference occurs between the "forward transmission time" and the "backward transmission time". No serious problem arose when the element performance was of a level that could ignore this difference. However, as the element performance has been improved recently, this difference cannot be ignored.

This difference causes signal fluctuations during high-speed rising and falling of a signal. Furthermore, since the characteristic impedance and the delay characteristic of a signal line cannot be fixed due to this difference, signal reflection between circuit elements of an integrated circuit or between input and output terminals of a circuit unit cannot be controlled, and delay of a signal due to wiring cannot be quantified, resulting in inconvenience. This makes difficult the circuit simulation indispensable in designing of an ultrahigh-speed integrated circuit.

In this manner, in a conventional integrated circuit, an increase in operating speed and in packing density is sought mainly by increasing the performance of the element or micropatterning the wiring. Substantially no consideration has been made on the signal reflection, high performance of the lines and the like, and an attempt to obtain an ultrahigh operation speed is limited.

SUMMARY OF THE INVENTION

It is the first object of the present invention to provide an integrated circuit device capable of an ultrahigh-speed operation by improving the structure of the signal lines.

It is the second object of the present invention to provide an integrated circuit device, simulation of which is easy to perform.

In order to achieve these objects, in an integrated circuit device according to the present invention, a plurality of circuit elements or circuit units are arranged on a substrate, and a plurality of signal lines are arranged between the terminals of the circuit elements or the circuit units, or between these terminals and connection terminals to be connected to external units. The present invention is characterized in that, in such a structure, a two-layered ground wiring layer having two layers vertically separated by a dielectric layer is provided, one layer is set as a high-potential DC power source line and the other layer is set as a low-potential DC power source line. These power source lines are arranged close to the signal lines in order to act as a AC ground line for controlling the transmission characteristics of the signal lines.

The transmission characteristics (a characteristic impedance, a delay characteristic, and the like) of the signal lines can be changed by changing a distance between a signal line and an adjacent ground line and a dielectric constant of a dielectric layer between them, which is known in the technique of a microwave strip line and the like.

In the present invention, each ground line has a structure in which two DC power source lines are stacked through a dielectric layer. In the parallel flat wiring formed by these two layers, when the thickness of the dielectric layer is sufficiently thinned compared to the width of a line and the dielectric constant is increased, the impedance between the two layers becomes sufficiently smaller than the impedance of the individual signal lines. When observed from the viewpoint signal line, the two layers have substantially the same potential in terms of a high frequency, and these two layers act as a single ground line for the signal line. As a result, a high-speed signal line is constituted.

The two layers constituting the ground line serve as the high-potential DC power source line and the low-potential power source line. Therefore, the high-speed signal lines and the DC power source wiring lines can be made considerably compact.

The power source wiring lines have a considerably low impedance, as described before. Therefore, they can withstand external noise and serve as the power source decoupling capacitor in terms of a concentrated constant. As a result, the fluctuation in power source voltage generated during the circuit operation is decreased, and an adverse effect of the power source voltage fluctuation on other functional units can be decreased.

According to the present invention, since the signal lines and the power source lines are integrally formed to constitute a transmission line, the substrate surface can be effectively utilized, and an integrated circuit capable of an ultrahigh-speed operation is realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of an integrated circuit according to the first embodiment of the present invention;

FIG. 3A is a plan view of a structure of a signal line portion according the second embodiment;

FIG. 3B is a sectional view taken along the line 3B—3B of FIG. 3A;

FIG. 3C is a sectional view taken along the line 3C—3C of FIG. 3A;

FIG. 3D is a sectional view taken along the line 3D—3D of FIG. 3A;

FIG. 4A is a plan view of a structure of a signal line portion according to the third embodiment;

FIG. 4B is a sectional view taken along the line 4B—4B of FIG. 4A;

DETAILED DESCRIPTION OF THE PREFERRED EMBODIMENTS

An integrated circuit device according to the first embodiment of the present invention will be described with reference to FIG. 1.

A plurality of circuit units $2a$, $2b$, $2c$, ... are formed on a substrate 1. The substrate 1 is, e.g., a semiconductor substrate, and the circuit units $2a$, $2b$, $2c$, ... are monolithically integrally formed on this substrate. Alternatively, the substrate 1 may not be a semiconductor substrate but, e.g., an insulating substrate, and the entire integrated circuit may be a hybrid integrated circuit having the circuit units $2a$, $2b$, $2c$, ... as the semiconductor element chips (including an integrated circuit and single semiconductor elements).

A large number of data signal lines 3 for connecting the terminals of the circuit units $2a$, $2b$, $2c$, ... and these terminals and external connection terminals are provided on the substrate 1. In FIG. 1, clock signal lines 4 are connected to the circuit units 2 in addition to the data signal lines 3. In addition to the signal lines 3 and 4, high-potential power source line (positive power source line) 11a and a low-potential power source line (negative power source line) 11b are stacked on the substrate 1 through an insulator.

A ground line utilizing the power source lines 11a and 11b may be provided adjacent to each data signal line 3 and, if necessary, to each clock signal line 4. The signal lines are set to have a desired transmission characteristic by utilizing such a ground line. Practical examples of such a signal line will be described below in detail.

Figure 2A:
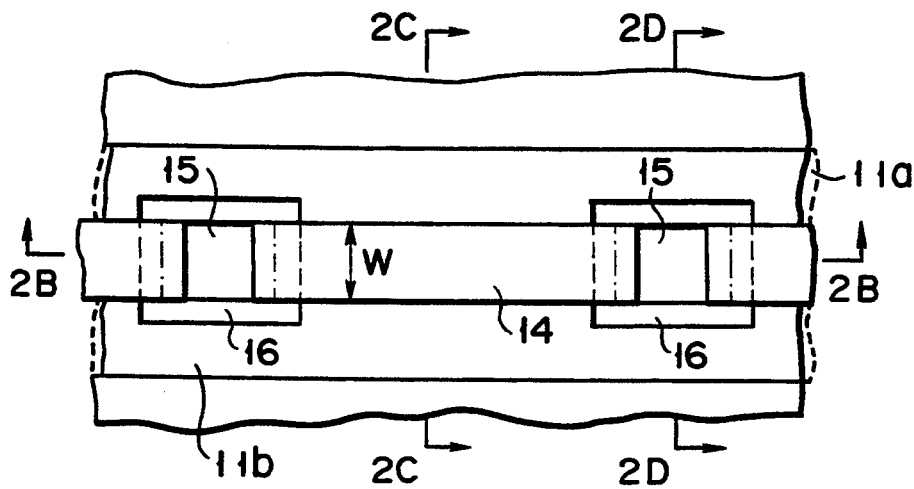
FIG. 2A is a plan view of a structure of a signal line portion according to the first embodiment.
Figure 2B:
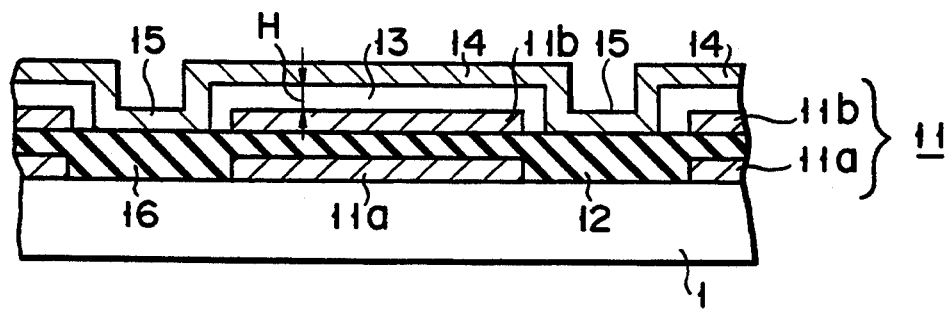
FIG. 2B is a sectional view taken along the line 2B—2B of FIG. 2A.
Figure 2C:
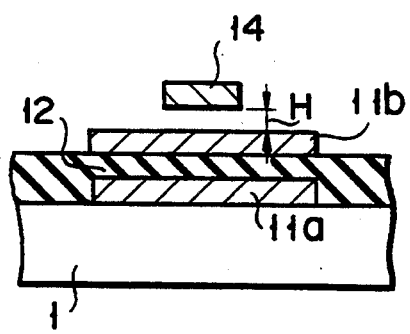
FIG. 2C is a sectional view taken along the line 2C—2C of FIG. 2A.
Figure 2D:
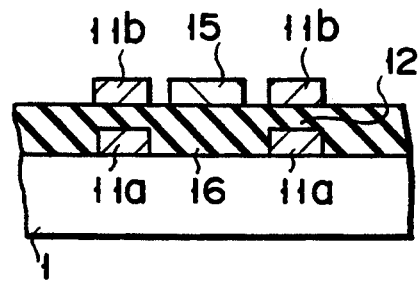
FIG. 2D is a sectional view taken along the line 2D—2D of FIG. 2A.

FIGS. 2A to 2D show the signal line structure of the first embodiment. FIG. 2A is a plan view of a single signal line portion, and FIGS. 2B, 2C, and 2D are sectional views taken along the lines 2B—2B, 2C—2C, and 2D—2D, respectively, of FIG. 2A.

Two metal layers of DC power source lines 11a and 11b are stacked on a substrate 1 through a dielectric layer 12. One of the DC power source lines 11a and 11b is the high-potential power source line (e.g., a positive power source Vcc line), and the other is the low-potential power source line (ground power source Vss line). The DC power source lines 11a and 11b are paired to serve as a ground line 11. More specifically, a third metal layer of a signal line 14 (the data signal line 3 or clock signal line 4 of FIG. 1) is provided on the ground line 11 through a predetermined gap H.

The signal line 14 has an air bridge structure. More specifically, the signal line 14 is separated from the ground line 11 by an air space 13 defined by the predetermined gap H on it. The line width W of the signal line 14 is smaller than that of the ground line 11.

Bridge piers 15 are formed in the signal line 14 in its longitudinal direction to be separated through a predetermined distance from each other, thereby imparting a predetermined mechanical strength to the signal line 14. At each bridge pier 15, the underlying AC ground line 11 is removed to provide a removal portion 16, and the signal line 14 is supported by the dielectric layer 12 at the removal portion 16 to constitute the bridge pier 15.

In this manner, according to this embodiment, the signal line 14 is integrally arranged with the ground line 11 to constitute a transmission line having a desired transmission characteristic. Thus, when this signal line 14 is used, signal reflection or delay between the circuit units of circuit elements connected by the signal line 14 is controlled, and the ultrahigh-speed circuit operation is realized.

The ground line 11 comprises two layers of DC power source lines sandwiching the dielectric layer 12. Thus, when the dielectric layer 12 is selected to have a desired dielectric constant or thickness, the power source impedance of the ground line 11 can be sufficiently decreased, and the ground line 11 can serve as power source lines withstanding against power source noise.

In the structure of this embodiment, the signal line 14 and the power source line 11 are integrally formed by stacking in order to reduce the size of the entire wiring.

In this embodiment, the bridge pier 15 of the signal line 14 is formed at the removal portion 16 where the ground line 11 is removed, so that an unnecessary increase in capacitance is suppressed. This also contributes to increase in signal processing speed of the circuit units.

Furthermore, according to this embodiment, since the signal lines and the power source lines are arranged as pairs, the area of the integrated circuit chip can be reduced, and the manufacturing cost is reduced accordingly.

Since the high-frequency wiring and power source wiring can be designed simultaneously, the design time is shortened and the possiblity of design mistakes is decreased.

The structure of the signal line portion according to the second embodiment of the present invention will be described with reference to FIGS. 3A to 3D. FIG. 3A is a plan view, and FIGS. 3B, 3C, and 3D are sectional views taken along the lines 3B—3B, 3C—3C, and 3D—3D, respectively, of FIG. 3A. The portions corresponding to those in FIGS. 2A to 2D are denoted by the same reference numerals and a detailed description thereof is omitted.

In this embodiment, two parallel signal lines 14a and 14b having basically the same structure as those of the first embodiment are arranged on a common ground line 11 (11a, 11b) to constitute a transmission line. Bridge piers 15a and 15b of the two signal lines 14a and 14b are so arranged as not to be adjacent to each other. More specifically, the bridge pier 15a of the signal line 14a is provided at a removal portion 16a where the signal line 14a is removed, and the bridge pier 15b of the signal line 14b is provided at a removal portion 16b where the signal line 14b is removed. The removal portions 16a and 16b are so arranged as not to be aligned in the lateral direction along the signal lines 14a and 14b.

The signal lines 14a and 14b have an air bridge structure. Therefore, the interline electromagnetic coupling is basically very weak, and withstands crosstalk accordingly.

A dielectric material 12 is present around each of the bridge piers 15a and 15b. Thus, when the bridge piers 15a and 15b of the signal lines 14a and 14b may be arranged to be adjacent to each other, the electromagnetic coupling becomes large compared to a case in which the signal lines 14a and 14b are completely separated by a space. When the bridge piers 15a and 15b of the parallel signal lines 14a and 14b on the common ground line 11 are arranged in, e.g., a staggered manner, as in this embodiment, such that they are not adjacent to each other, the crosstalk can be further decreased.

When three or more signal lines are to be arranged in parallel to each other, the crosstalk can be decreased by making a consideration similar to that described above.

The structure of the signal line according to the third embodiment of the present invention will be described with reference to FIGS. 4A and 4B. FIG. 4A is a plan view, and FIG. 4B is a sectional view taken along the line 4B—4B of FIG. 4A.

In this embodiment, unlike in the embodiments described above, a signal line 14 is arranged on the side of ground line 11 (11a, 11b) to be adjacent to it. The signal line 14 is formed on an insulating film 17. In this embodiment, the signal line 14 is located on the side of an upper power source line 11b of power source lines 11a and 11b constituting the ground line 11.

The insulating film 17 may be formed in accordance with the same manufacturing steps as those of a dielectric layer 12 provided between the power source lines 11a and 11b, or may be formed in accordance with other manufacturing steps. Note that patterning must be performed such that a side surface of the insulating film 17 opposing a side surface of the ground line 11 must be flush with a side surface of the signal line 14. As a result, the signal line 14 is substantially adjacent to the ground line 11 through a space 18 in substantially the same manner as in the embodiments described above.

The signal line 14 can have a desired transmission characteristic even if it is not stacked on the ground line 11, by appropriately designing the gap between it and the ground line 11 or the line width.

Figure 5A:
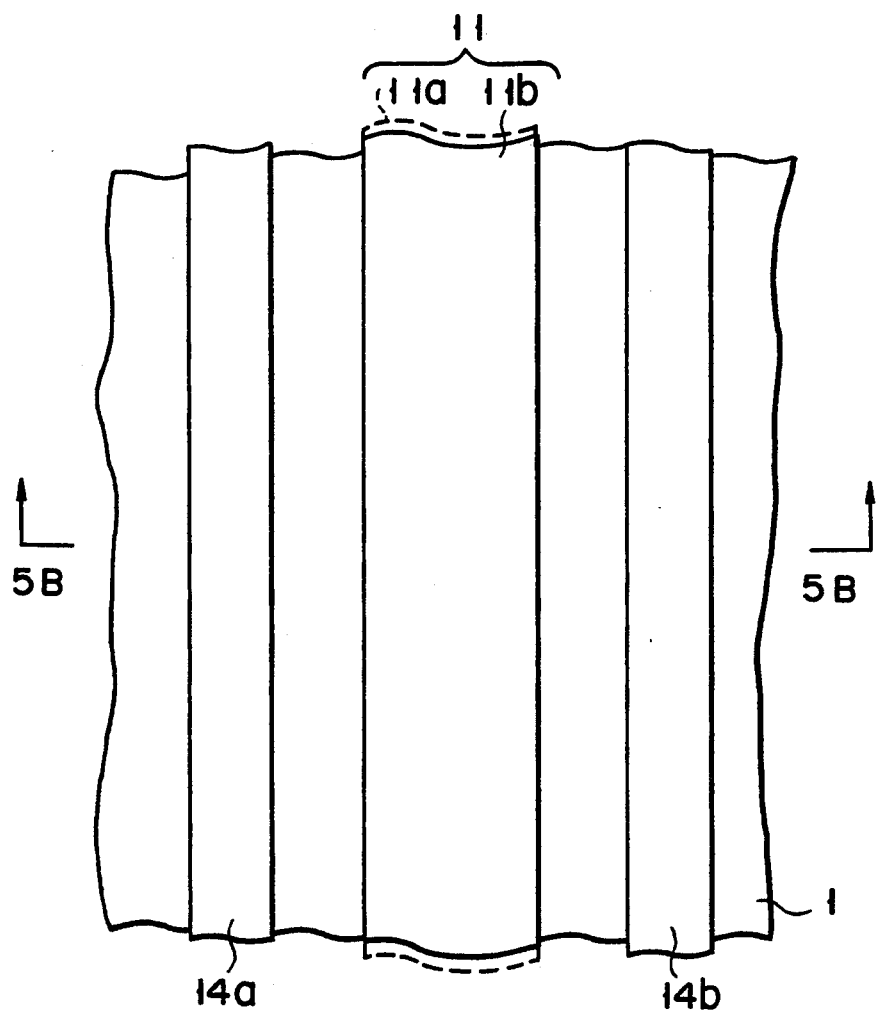
FIG. 5A is a plan view of a structure of a signal line portion according to the fourth embodiment.
Figure 5B:
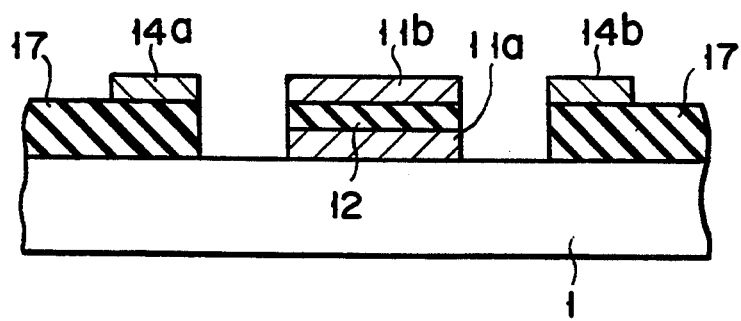
FIG. 5B is a sectional view taken along the line 5B—5B of FIG. 5A.

The structure of the signal line according to the fourth embodiment of the present invention will be described with reference to FIGS. 5A and 5B. The structure of this embodiment is obtained by expanding the structure of the signal line shown in FIG. 4. FIG. 5A is a plan view, and FIG. 5B is a sectional view taken along the line 5B—5B of FIG. 5A.

This embodiment is different from the embodiments described above in that signal lines 14a and 14b are symmetrically arranged on two sides of an ground line 11.

This embodiment is particularly preferable for processing complimentary signals as the two signal lines 14a and 14b have the same transmission characteristic. For example, this embodiment is suitably used in a circuit that operates complimentarily, e.g., an ECL circuit as a basic circuit of a high-speed logic circuit using a bipolar transistor and an SCFL circuit as a basic circuit of a high-speed logic circuit using an FET.

In a circuit that operates complimentarily, two signals having opposite phases are input through two signal lines. When one logic processing is performed, the signals are output as complimentary signals. At this time, a single functional circuit unit must have two signal lines and one pair of power source lines. In this embodiment, such lines are provided as a single set. Furthermore, the respective signal lines 14a, 14b can be treated as transmission lines. Therefore the structure of this embodiment is quite convenient for high-speed operation.

Also, since the two signal lines 14a and 14b are formed on the two sides of the ground line 11, substantially no electromagnetic coupling occurs to cause a crosstalk and the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An integrated circuit device, comprising:
   a substrate;
   a plurality of circuit elements arranged on said substrate and having terminals;
   a plurality of signal lines connected between said terminals of said circuit elements; and
   a ground line provided close to said signal lines for controlling transmission characteristics of said signal lines, said ground line including a high-potential direct current power source line and a low-potential direct current power source line, said high-potential direct current power source line and said low-potential direct current power source line being vertically stacked and separated by a dielectric layer therebetween, said high-potential and low potential direct current power source lines and at least one of said signal lines extending in a parallel direction with each other, wherein the thickness of the dielectric layer is sufficiently thin compared with a width of said high-potential and low-potential direct current power source lines so that the impedance of said high-potential and low potential direct current power source lines is sufficiently less than the impedance between the signal lines so that said high-potential and low-potential direct current power source lines have substantially the same potential in terms of a high frequency and thereby function as a single ground line for the signal line.

2. A device according to claim 1, wherein
said signal lines are stacked over said ground line to have an air bridge structure,
said signal lines have bridge piers to support said signal lines, and
said bridge piers are formed over a portion of said substrate from which said ground line is removed.

3. A device according to claim 1, wherein
said plurality of signal lines have first and second line members extending parallel to each other being at least partially adjacent to each other, and
said first and second signal line members are formed over said ground line to have an air bridge structure, said ground line being common to both said first and second signal line members.

4. A device according to claim 3, wherein
said first and second signal line members have bridge piers for supporting said first and second signal line members, and
said bridge piers are arranged so as to prevent overlapping with each other in the parallel extending direction.

5. A device according to claim 1, wherein said signal lines are arranged on said substrate through an insulating film close to a side of said ground line.

6. A device according to claim 1, wherein
said plurality of signal lines have first and second signal line members extending at least partially parallel to each other, and
said first and second signal line members are arranged on said substrate through an insulating film while sandwiching said ground line therebetween, said ground line being common to both of said first and second signal line members.

7. An integrated circuit device, comprising:
a substrate;
a plurality of circuit elements arranged on said substrate and having terminals;
a plurality of signal lines connected between said terminals and external connection terminals; and
a ground line provided close to said signal lines for controlling transmission characteristics of said signal lines, said ground line including a high-potential direct current power source line and a low-potential direct current power source line, said high-potential direct current power source line and said low-potential direct current power source line being vertically stacked and separated by a dielectric layer therebetween, said high-potential and low potential direct current power source lines and at least one of said signal lines extending in a parallel direction with each other, wherein the thickness of the dielectric layer is sufficiently thin compared with a width of said high-potential and low-potential direct current power source lines so that the impedance of said high-potential and low potential direct current power source lines is sufficiently less than the impedance between the signal lines so that said high-potential and low-potential direct current power source lines have substantially the same potential in terms of a high frequency and thereby function as a single ground line for the signal line.

* * * * *